United States Patent
Bruyneel et al.

(10) Patent No.: US 8,777,452 B2
(45) Date of Patent: Jul. 15, 2014

(54) PRINTED CIRCUIT BOARD FOR PROVIDING AMBIENT LIGHT

(75) Inventors: Filip Bruyneel, Ledeberg (BE); Alfred Peeters, Oostkamp (BE)

(73) Assignee: TP Vision Holding B.V., Eindhoven (NL)

( * ) Notice: Subject to any disclaimer, the term of this patent is extended or adjusted under 35 U.S.C. 154(b) by 163 days.

(21) Appl. No.: 13/321,183

(22) PCT Filed: May 5, 2010

(86) PCT No.: PCT/IB2010/051974
§ 371 (c)(1),
(2), (4) Date: Jan. 25, 2012

(87) PCT Pub. No.: WO2010/133992
PCT Pub. Date: Nov. 25, 2010

(65) Prior Publication Data
US 2012/0113644 A1    May 10, 2012

(30) Foreign Application Priority Data

May 20, 2009  (EP) .................................... 09160733

(51) Int. Cl.
*F21V 21/00*  (2006.01)

(52) U.S. Cl.
USPC ............ 362/249.04; 362/217.14; 362/249.01; 362/249.02; 362/249.03; 362/249.08; 257/99

(58) Field of Classification Search
USPC ............. 362/217.14, 249.01–249.04, 249.07, 362/249.08; 257/99; 313/511
See application file for complete search history.

(56) References Cited

U.S. PATENT DOCUMENTS

| 2003/0086049 | A1 | 5/2003 | Kawamura et al. |
| 2006/0198128 | A1 | 9/2006 | Piepgras et al. |
| 2006/0227003 | A1 * | 10/2006 | Ven .......................... 340/815.45 |
| 2008/0067526 | A1 | 3/2008 | Chew |
| 2010/0277666 | A1 | 11/2010 | Bertram et al. |

FOREIGN PATENT DOCUMENTS

| DE | 10326368 A1 | 12/2004 |
| DE | 102007023651 A1 | 11/2008 |

(Continued)

OTHER PUBLICATIONS

Anonymous: "OLED Panel With Ambient Light"; Technical Disclosure, Downloaded From http://www.IP.com/PUBVIEW/IPCOM000153873D, June 2007, 2 page Document.

*Primary Examiner* — Stephen F Husar
*Assistant Examiner* — Meghan Dunwiddie
(74) *Attorney, Agent, or Firm* — Shimokaji & Assoc., P.C.

(57) ABSTRACT

An oblong sized printed circuit board (1) comprises light emitting diode circuitry (2, 3). Parts of the printed circuit board (1) are flexible in at least one direction, to improve a manufacturing efficiency. Preferably, the printed circuit board (1) can make curves in length and width directions and does not require holes for screws. The light emitting diode circuitry (2, 3) may comprise light emitting diode circuits (2) with light emitting diodes and other circuitry (3) such as a driver for driving light emitting diode circuits (2) individually for providing ambient light for a display (5). A device (100) comprising the printed circuit board (1) may further comprise the display (5). Such a device (100) is for example a television receiver/display device/screen device. The printed circuit board (1) may be attached to structures (61, 62) moveable by hand/machine for directing the ambient light. The device (100) may be a roll (101) for rolling up the printed circuit board (1).

15 Claims, 6 Drawing Sheets

(56) References Cited

FOREIGN PATENT DOCUMENTS

| | | | |
|---|---|---|---|
| WO | 2005076602 | A1 | 8/2005 |
| WO | 2005088390 | A1 | 9/2005 |
| WO | 2007026285 | A1 | 3/2007 |
| WO | 2008068718 | A2 | 6/2008 |

* cited by examiner

PRINTED CIRCUIT BOARD FOR PROVIDING AMBIENT LIGHT

FIELD OF THE INVENTION

The invention relates to a printed circuit board. The invention also relates to a device comprising such a printed circuit board, and further relates to a method.

Examples of such a printed circuit board are oblong printed circuit boards. Examples of such a device are consumer products and other kinds of products.

BACKGROUND OF THE INVENTION

WO 2005/088390 discloses a display device including a display and including an illumination unit for generating main radiation and subsidiary radiation and including filtering units for filtering the subsidiary radiation to generate aura radiation.

SUMMARY OF THE INVENTION

It is an object of the invention to provide a printed circuit board for a relatively efficient production process of a device comprising a light emitting diode circuit for providing ambient light for a display. Further objects of the invention are to provide a device comprising such a printed circuit board and to provide a method.

According to a first aspect of the invention, a printed circuit board is provided having an oblong size and comprising light emitting diode circuitry, parts of the printed circuit board being flexible in at least one direction, the light emitting diode circuitry comprising light emitting diode circuits and other circuitry, the other circuitry comprising a driver for driving the light emitting diode circuits individually for providing ambient light for a display.

An oblong printed circuit board with light emitting diode circuitry and with flexible parts will improve an efficiency of a manufacturing process of a device comprising a light emitting diode circuit for providing ambient light for a display. The combination of the oblong size and the flexibility will increase freedom of design, offer more possibilities, allow larger tolerances and save time during manufacturing. As a result, the production process of the device comprising the light emitting diode circuit for providing ambient light for a display can become more efficient.

A plane having an oblong size is defined to have a length direction and a width direction, the length direction being at least ten times larger than the width direction. A plane having flexible parts implies that other parts of the plane may be more flexible or just as flexible or less flexible or not flexible at all.

A driver mounted on a flexible printed circuit board should be considered to be a revolution in an ambient light environment. Drivers have relatively small outputs that need to be connected to relatively small connections, and these relatively small sizes were, in the past, considered to be impossible to be located on a flexible printed circuit board. The driver for example has several respective outputs for driving several respective light emitting diode circuits individually for a light output control and/or color control and/or intensity control per individual light emitting diode circuit.

According to an embodiment, the printed circuit board is defined by the other circuitry further comprising a memory for storing color information for at least one of the light emitting diode circuits. A combination of the driver and the memory for example allows five light emitting diode circuits to be controlled individually. Fewer than five or more than five light emitting diode circuits are not to be excluded.

According to an embodiment, the printed circuit board is defined by each light emitting diode circuit comprising one or more light emitting diodes for providing the ambient light. Each light emitting diode circuit for example comprises six light emitting diodes. Fewer than six or more than six light emitting diodes are not to be excluded.

The other circuitry may for example further comprise one or more further drivers, one or more further memories, one or more sensors, one or more connectors, one or more processors etc.

According to an embodiment, the printed circuit board is defined by areas of the printed circuit board covered by the light emitting diode circuitry being less flexible than the flexible parts, the at least one direction comprising a first direction and comprising a second direction different from the first direction, the first direction being a length direction such that the printed circuit board can make a curve in the length direction, and the second direction being a width direction such that the printed circuit board can make a curve in the width direction. An area covered by a circuit is usually less flexible. Flexibility in two different directions will further increase freedom of design, further offer more possibilities, further allow larger tolerances and further save time during manufacturing. Making a curve in the length direction implies that when the length direction forms part of a plane, one side of the length direction can stay in the plane while, at the same time, the other side can move out of the plane. Making a curve in the width direction implies that when the width direction forms part of the plane, one side of the width direction can stay in the plane while, at the same time, the other side can move out of the plane.

According to an embodiment, the printed circuit board is defined by the curve in the length direction allowing the printed circuit board to be rolled up or to be bended around an edge or a corner, and the curve in the width direction allowing the printed circuit board to be bended around a further edge or a further corner.

According to an embodiment, the printed circuit board is defined by the printed circuit board not comprising any holes for screws. Preferably, the printed circuit board may be attached to a device-part or to a structure in an adhered manner.

According to a second aspect of the invention, a device is provided comprising the printed circuit board as defined above.

According to an embodiment, the device is defined by the device further comprising the display, each light emitting diode circuit comprising one or more light emitting diodes for providing the ambient light. Such a device is for example a television receiver or a display device or a screen device.

According to an embodiment, the device is defined by a first piece of the printed circuit board being attached to a first plane of a first device-part and a second piece of the printed circuit board being attached to a second plane of a second device-part, and the first and second pieces being separate pieces that are interconnected via an interconnection. Here, the flexibility is mainly used for easy attachment.

According to an embodiment, the device is defined by a first piece of the printed circuit board being attached to a first plane of a first device-part and a second piece of the printed circuit board being attached to a second plane of a second device-part, the first and second planes being different planes, and a third piece of the printed circuit board making a curve to go from one of the first and second planes to the other one of the first and second planes, the third piece being an intermediate piece between the first and second pieces. Here, the flexibility is used for easy attachment and is also used for making a curve between different planes.

In each case, the first and second device-parts may be the same device-part or may be different device-parts.

According to an embodiment, the device is defined by a first piece of the printed circuit board being attached to a first side of a device-part and a second piece of the printed circuit board being attached to a second side of the device-part, the first and second sides being different sides, and a third piece of the printed circuit board making a curve to go around an edge or a corner of the device-part, the third piece being an intermediate piece between the first and second pieces. Here, the flexibility is used for easy attachment and is also used for making a curve around a device-part.

According to an embodiment, the device is defined by at least a part of the printed circuit board being attached to a moveable structure for directing the ambient light. The moveable structure may be moved by hand or by machine. The whole printed circuit board may be attached to the moveable structure, in which case the flexibility is mainly used for easy attachment. Or a part of the printed circuit board may be attached to the moveable structure, and another part of the printed circuit board may be attached to another moveable or non-moveable structure, in which case the flexibility is used for easy attachment and is also used for (flexibly) bridging both structures.

According to an embodiment, the device is defined by the device not comprising a reflector for reflecting the ambient light. Preferably, a reflector for reflecting and guiding the ambient light is to be avoided, and the flexibility of the printed circuit board is to be used for said guiding.

According to an embodiment, the device is defined by the device being a roll, and the printed circuit board being rolled up on the roll. Such a roll may comprise up to eight meter (today) or more (in the future) of printed circuit board.

According to a third aspect of the invention, a method is provided for providing a device with a printed circuit board having an oblong size and comprising light emitting diode circuitry, the light emitting diode circuitry comprising light emitting diode circuits and other circuitry, the other circuitry comprising a driver for driving the light emitting diode circuits individually for providing ambient light for a display, the method comprising a step of using a flexibility in at least one direction of parts of the printed circuit board.

Embodiments of the device and of the method may correspond with the embodiments of the printed circuit board.

An insight might be that prior art non-flexible (rigid) printed circuit boards with light emitting diode circuitry have a maximum length of 0.46 meter and that television receivers have a width and a height that are different from and usually not a multiple of 0.46 meter and that are sometimes more than twice as large.

A basic idea might be that the printed circuit board should have an oblong size and should be at least partially flexible in at least one direction and should comprise light emitting diode circuitry comprising light emitting diode circuits and a driver for driving the light emitting diode circuits individually for providing ambient light for a display.

A problem to provide a printed circuit board for a relatively efficient production process of a device comprising a light emitting diode circuit for providing ambient light for a display has been solved. The combination of the oblong size and the flexibility will increase freedom of design, offer more possibilities, allow larger tolerances and save time during manufacturing.

A further advantage might be that a light emitting diode pitch can be reduced much (a reduced distance between two neighboring light emitting diodes will improve the quality of the ambient light owing to the fact that numbers and/or sizes of hot-spots will be reduced or even avoided), that instead of one driver (one memory, one sensor) per non-flexible printed circuit board of at most 0.46 meter, one driver (one memory, one sensor) per flexible printed circuit board of usually longer size than 0.46 meter is required, that flexible printed circuit board is thinner (for example a factor three) than rigid printed circuit board, and that less connectors may be required (a reduced number of components will reduce the production costs, large television receivers with three/four sided ambient light require fourteen/twenty connectors for interconnecting rigid boards where a use of flexible boards would reduce these numbers to six, two or even zero connectors).

These and other aspects of the invention are apparent from and will be elucidated with reference to the embodiment(s) described hereinafter.

DETAILED DESCRIPTION OF EMBODIMENTS

Figure 1:
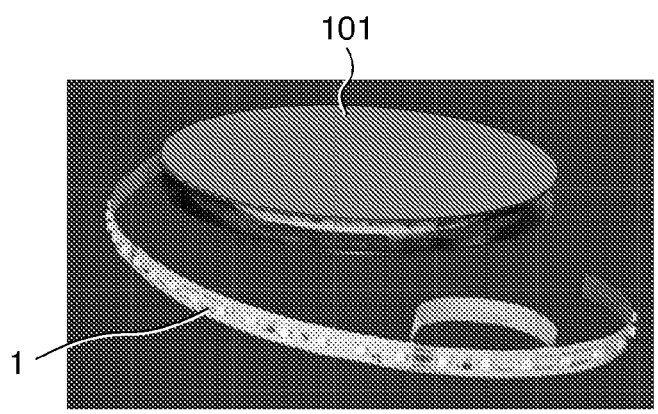
FIG. 1 shows a roll comprising a flexible printed circuit board.

In the FIG. 1, a roll 101 is shown comprising a flexible printed circuit board 1 with circuits.

Figure 2:
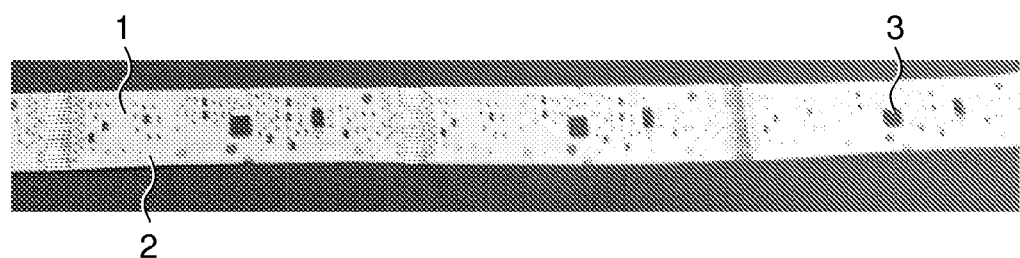
FIG. 2 shows a flexible printed circuit board.

In the FIG. 2, a flexible printed circuit board 1 is shown comprising a light emitting diode circuit 2 and other circuitry 3 such as a driver, a memory, a sensor, a connector, a processor etc.

Figure 3:
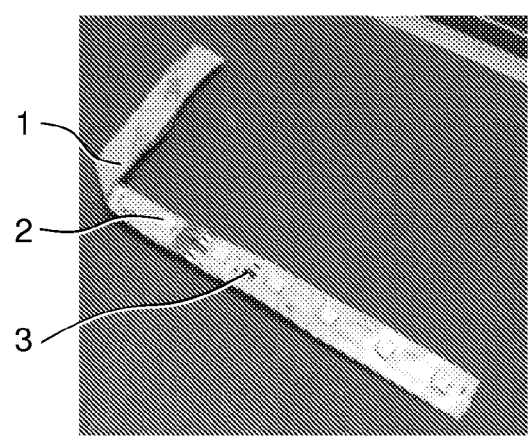
FIG. 3 shows a bended flexible printed circuit board.

In the FIG. 3, a bended flexible printed circuit board 1 is shown comprising a light emitting diode circuit 2 and other circuitry 3 such as a driver, a memory, a sensor, a connector, a processor etc.

The driver for example drives light emitting diode circuits 2 individually for providing ambient light for a display. The memory for example stores color information for at least one of the light emitting diode circuits 2. The light emitting diode circuits 2 each comprise one or more light emitting diodes for providing the ambient light.

Figure 4:
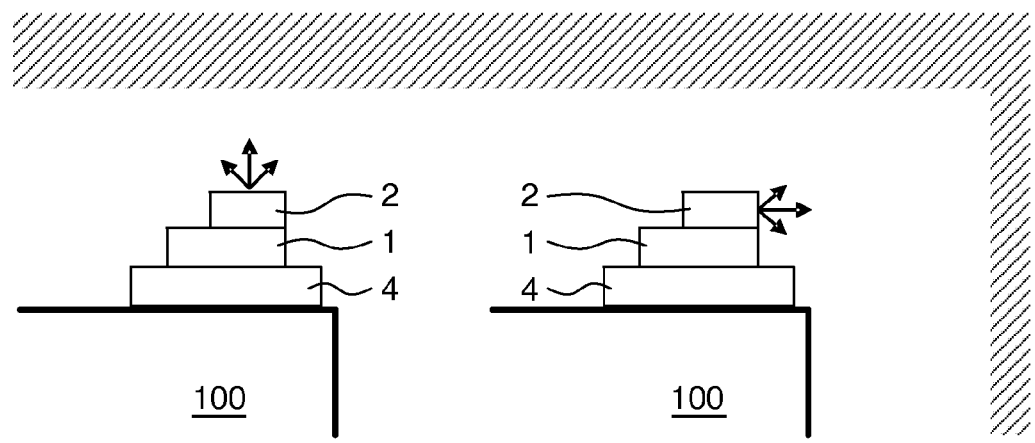
FIG. 4 shows top and side emitting diodes at the back of a device.

In the FIG. 4, light emitting diode circuits 2 are shown comprising one or more light emitting diodes that emit in a top direction (left) and in a side direction (right). The light emitting diode circuits 2 are located on the flexible printed circuit board 1, which is attached to metal 4 located at the back of a device 100.

Figure 5:
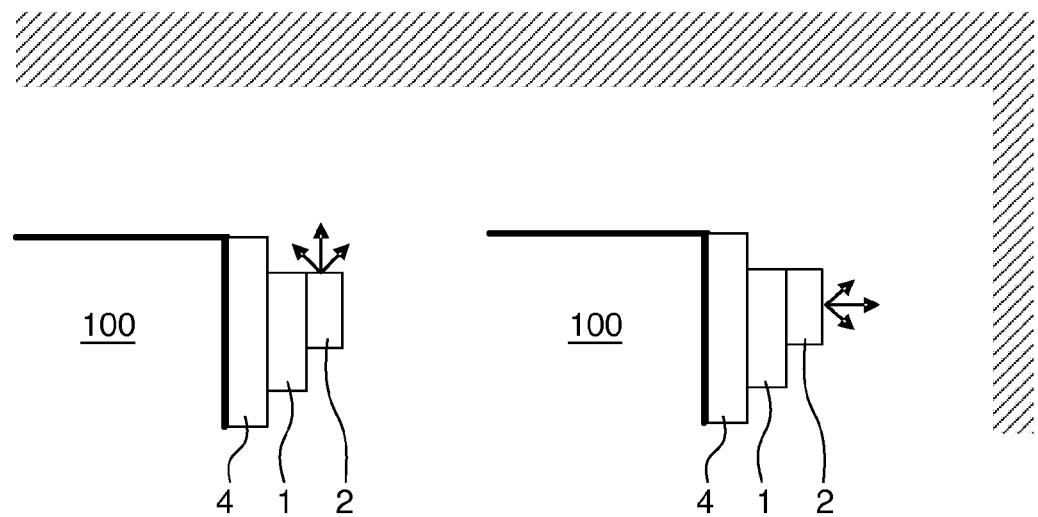
FIG. 5 shows side and top emitting diodes at the side of a device.

In the FIG. 5, light emitting diode circuits 2 are shown comprising one or more light emitting diodes that emit in a side direction (left) and in a top direction (right). The light emitting diode circuits 2 are located on the flexible printed circuit board 1, which is attached to metal 4 located at the (right) side of a device 100.

Figure 6:
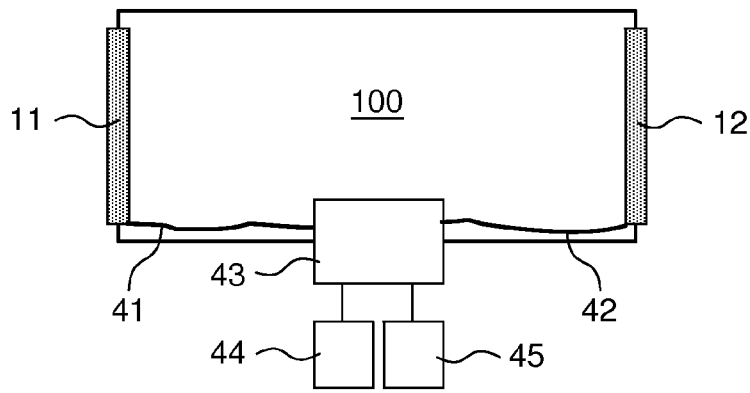
FIG. 6 shows a device with two-sided ambient light.

In the FIG. 6, a device 100 is shown with two-sided ambient light. A piece 11 of the printed circuit board is located vertically at a left side of the device 100, and a piece 12 of the printed circuit board is located vertically at a right side of the device 100. The pieces 11 and 12 are connected to an interface board 43 via cables 41 and 42. The interface board 43 is further for example coupled to a video processor 44 and a power supply 45.

Figure 7:
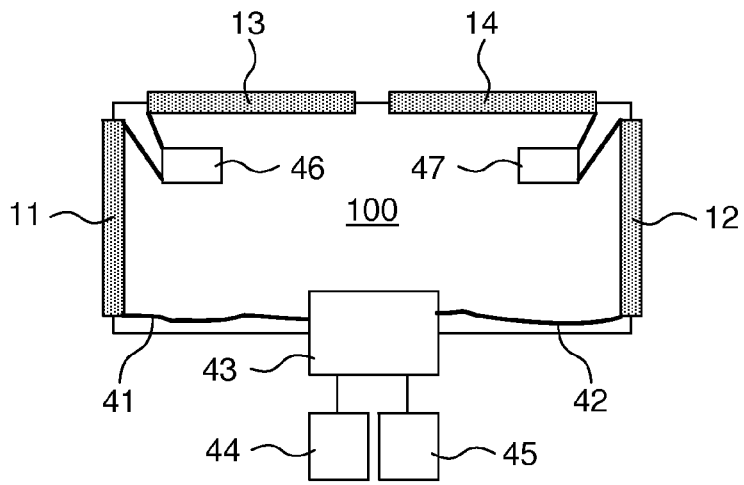
FIG. 7 shows a device with three-sided ambient light.

In the FIG. 7, a device 100 is shown with three-sided ambient light. A first piece 11 (12) of the printed circuit board is attached to a first plane of a first device-part, vertically at a left (right) side, and a second piece 13 (14) of the printed circuit board is attached to a second plane of a second device-part, horizontally at a top. The first and second pieces 11 and 13 (12 and 14) are separate pieces that are interconnected via an interconnection 46 (47) such as an interconnecting board. The pieces 11 and 12 are connected to an interface board 43 via cables 41 and 42.

Figure 8:
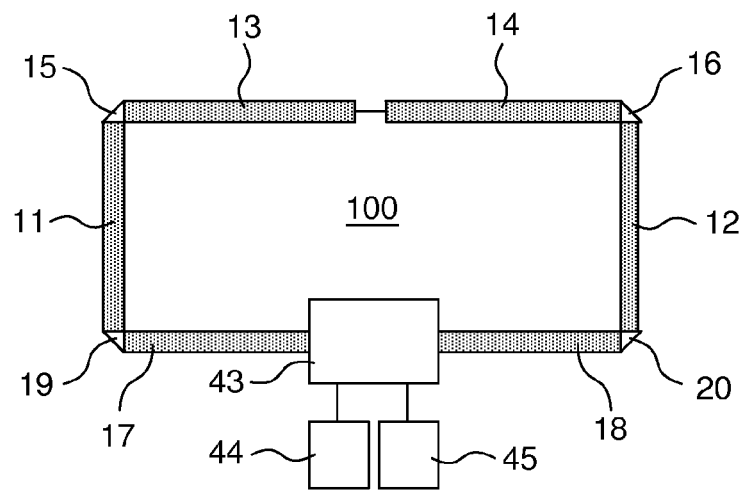
FIG. 8 shows a device with four-sided ambient light.

In the FIG. 8, a device 100 is shown with four-sided ambient light. A first piece 11 (12) of the flexible printed circuit board is attached to a first plane of a first device-part, vertically at a left (right) side, and a second piece 13 (14) of the flexible printed circuit board is attached to a second plane of a second device-part, horizontally at a top. A third piece 15 (16) of the flexible printed circuit board makes a curve to go from one of the first and second planes to the other one of the first and second planes. The third piece 15 (16) is an intermediate piece between the first and second pieces 11 and 13 (12 and 14). Similarly, the first piece 11 (12) of the flexible printed circuit board is attached to the first plane of the first device-part, vertically at a left (right) side, and a fourth piece 17 (18) of the flexible printed circuit board is attached to a third plane of a third device-part, horizontally at a bottom. A fifth piece 19 (20) of the flexible printed circuit board makes a curve to go from one of the first and third planes to the other one of the first and third planes. The fifth piece 19 (20) is an intermediate piece between the first and fourth pieces 11 and 17 (12 and 18). The pieces 17 and 18 are connected directly to an interface board 43 such that, in this embodiment, cables between pieces and the board are avoided and interconnections between different pieces are avoided.

Figure 9:
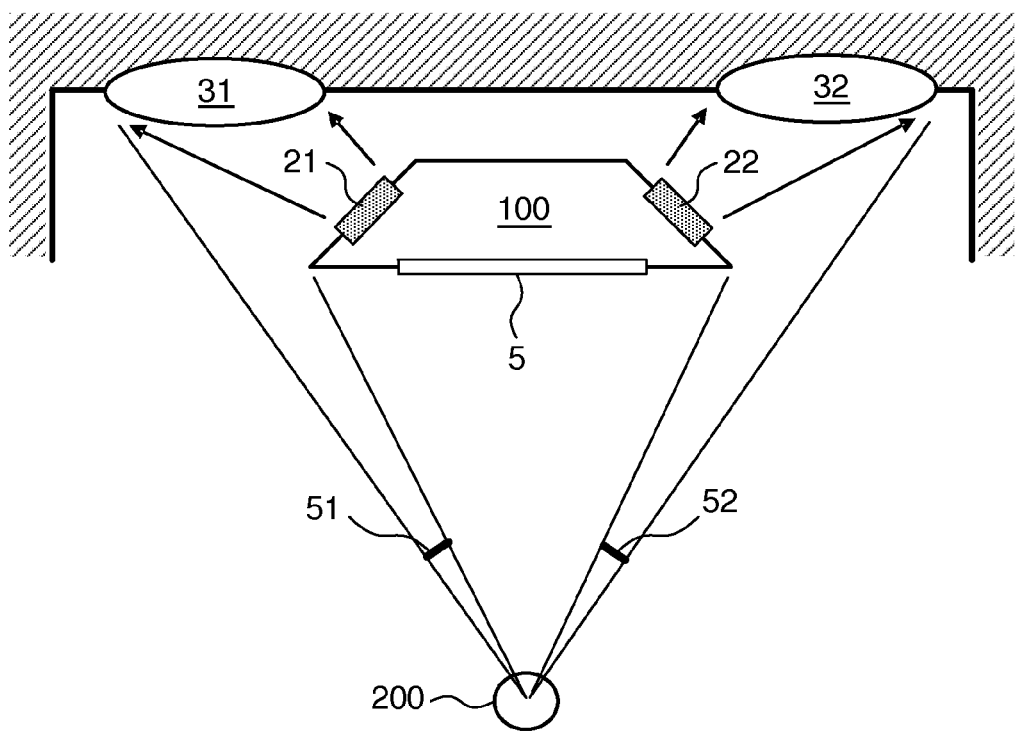
FIG. 9 shows a first viewer experience for a device with two ambient light sources.

In the FIG. 9, a first viewer experience is shown for a device 100 with two ambient light sources such as pieces 21 and 22 of the printed circuit board. The device 100 further comprises a display 5. The piece 21 produces a halo 31 on the wall and the piece 22 produces a halo 32 on the wall. A viewer 200 at a central position watches the display 5 while at the same time enjoying a part of the halo 31 (this part being defined by an angle 51) and enjoying a part of the halo 32 (this part being defined by an angle 52).

Figure 10:
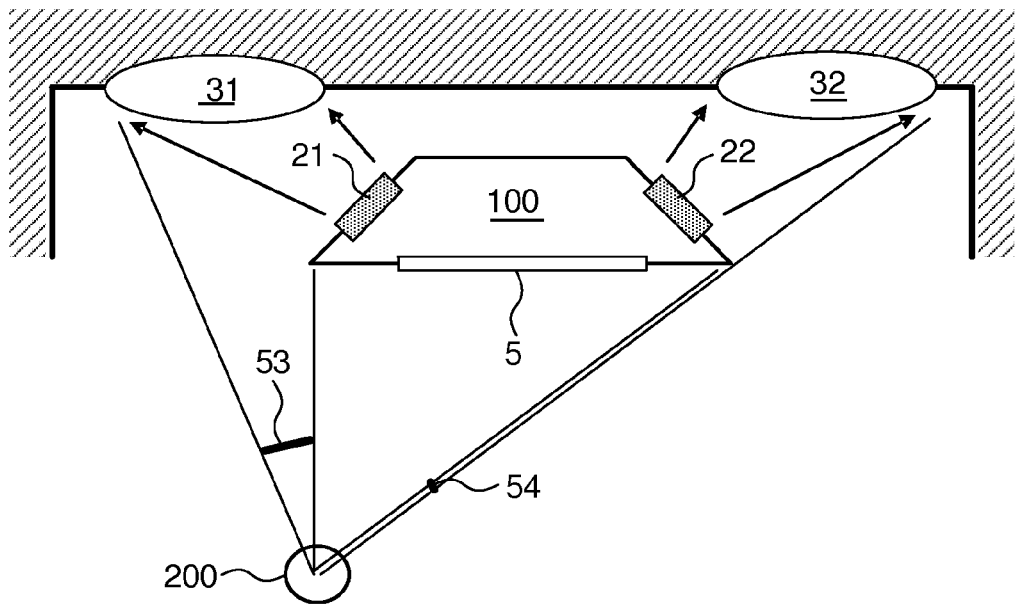
FIG. 10 shows a second viewer experience for a device with two ambient light sources.

In the FIG. 10, a second viewer experience is shown for a device 100 with two ambient light sources such as pieces 21 and 22 of the printed circuit board. The device 100 further comprises a display 5. The piece 21 produces a halo 31 on the wall and the piece 22 produces a halo 32 on the wall. A viewer 200 sitting too much to the left at a non-central position watches the display 5 while at the same time enjoying a (now larger) part of the halo 31 (this part being defined by an angle 53 that is larger than the angle 51) but not enjoying any part of the halo 32 (this to the viewer invisible part being defined by an angle 54 that has a value close to zero and is much smaller than the angle 52).

Figure 11:
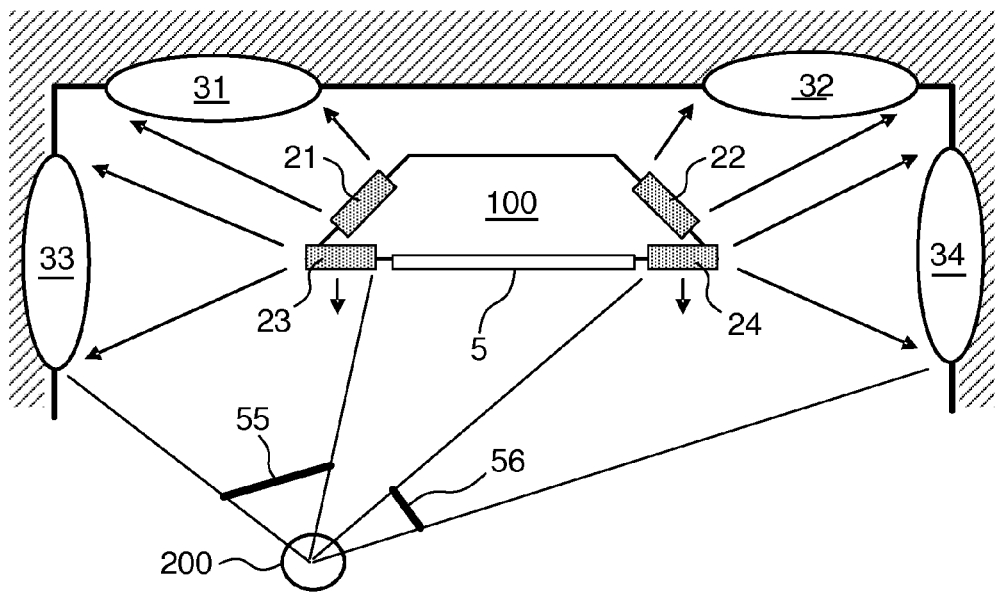
FIG. 11 shows a third viewer experience for a device with four ambient light sources.

In the FIG. 11, a third viewer experience is shown for a device 100 with four ambient light sources such as pieces 21-24 of the printed circuit board. The device 100 further comprises a display 5. The piece 21 produces a halo 31 on the (back) wall and the piece 22 produces a halo 32 on the (back) wall and the piece 23 produces a halo 33 of the (left side) wall and the piece 24 produces a halo 34 on the (right side) wall. The pieces 23 and 24 further produce light towards a viewer 200. This viewer 200 sitting too much to the left at a non-central position watches the display 5 while at the same time enjoying a combination of (a part of) the halo 31 and the halo 33 and light coming directly from the piece 23 (this combination being defined by an angle 55) and enjoying a combination of the halo 34 and light coming directly from the piece 24 (this combination being defined by an angle 56). So, by having introduced more ambient light sources, a viewer's position has become less crucial for being able to enjoy the ambient light.

Figure 12:
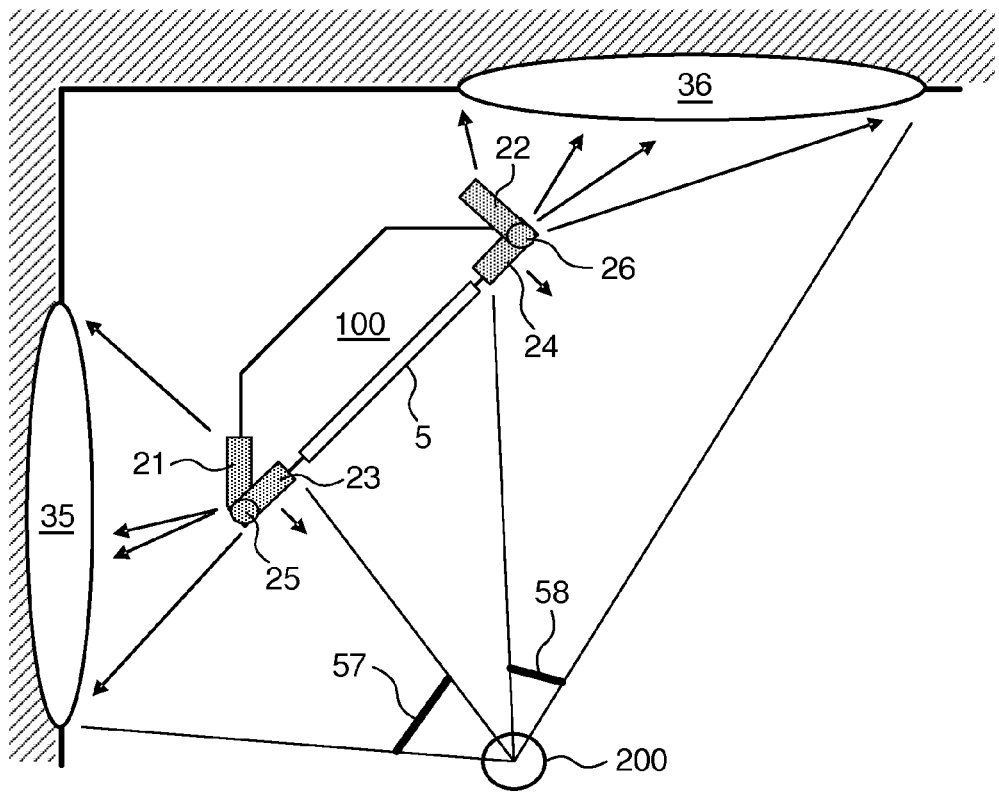
FIG. 12 shows a fourth viewer experience for a device with four ambient light sources.

In the FIG. 12, a fourth viewer experience is shown for a device 100 with four ambient light sources such as pieces 21-26 of the flexible printed circuit board. The device 100 further comprises a display 5. A first piece 21 (22) of the flexible printed circuit board is attached to a first side of a device-part and a second piece 23 (24) of the flexible printed circuit board is attached to a second side of the device-part. The first and second sides are different sides A third piece 25 (26) of the flexible printed circuit board makes a curve to go around an edge or a corner of the device-part. This third piece 25 (26) is an intermediate piece between the first and second pieces 21 and 23 (22 and 24). The pieces 21 and 23 and 25 produce a halo 35 on the (left side) wall and the pieces 22 and 24 and 26 produce a halo 36 on the (back) wall. The pieces 23 and 24 further produce light towards a viewer 200. This viewer 200 sitting too much to the left at a non-central position watches the display 5 while at the same time enjoying a combination of (a part of) the halo 35 and light coming directly from the piece 23 (this combination being defined by an angle 57) and enjoying a combination of (a part of) the halo 36 and light coming directly from the piece 24 (this combination being defined by an angle 58).

The angle between the pieces 21 and 23 is different from the angle between the pieces 22 and 24 and, preferably, these angles can be chosen and/or adapted. So, the flexible printed circuit board allows these angles to be chosen differently and/or to be adjusted by hand and/or by machine as shown in the FIG. 15 to create an optimal viewer experience while taking into account a position of the device with respect to its environment and/or while taking into account a configuration of the environment and/or while taking into account a viewer's position.

Figure 13:
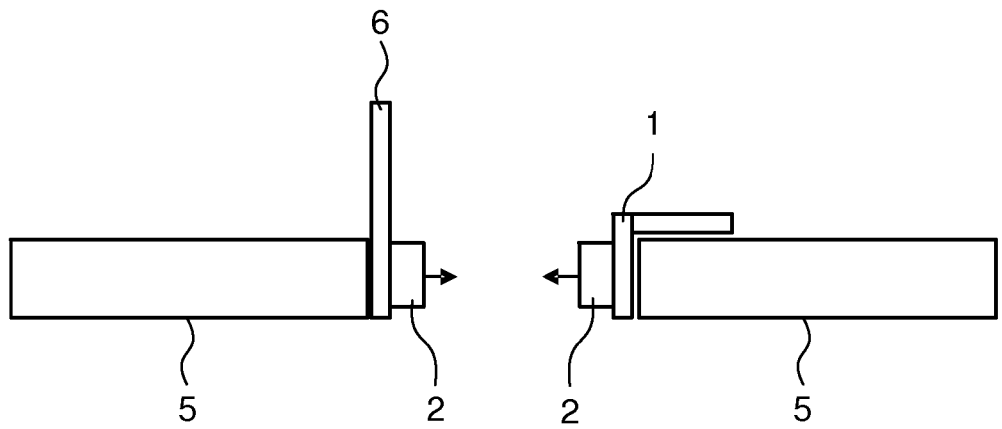
FIG. 13 shows a display with a first prior art printed circuit board and with a first flexible printed circuit board.

In the FIG. 13, a display 5 is shown with (left) a first prior art printed circuit board 6 and with (right) a first flexible printed circuit board 1. The first prior art printed circuit board 6 is rigid and cannot be bended, the first flexible printed circuit board 1 has been bended to advantageously better match the relatively thin display 5. Both printed circuit boards 1 and 6 each comprise a light emitting diode circuit 2.

Figure 14:
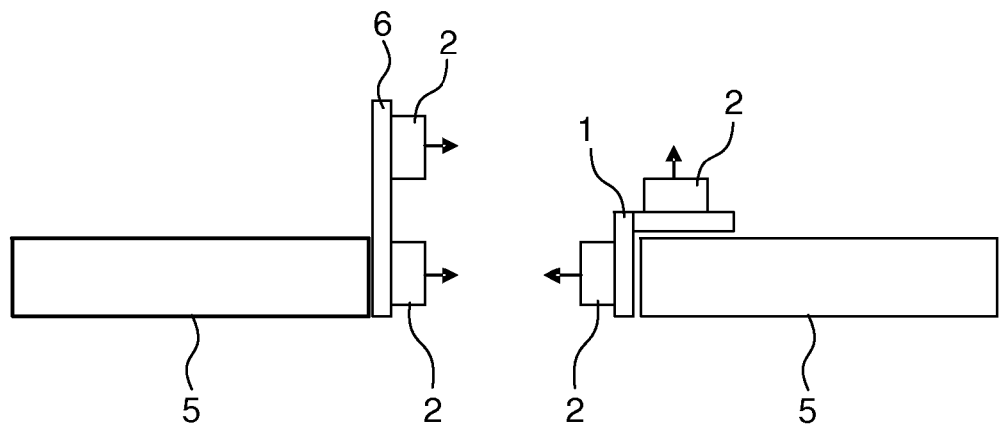
FIG. 14 shows a display with a second prior art printed circuit board and with a second flexible printed circuit board.

In the FIG. 14, a display 5 is shown with (left) a second prior art printed circuit board 6 and with (right) a second flexible printed circuit board 1. Compared to the first printed circuit boards shown in the FIG. 13, in the FIG. 14 each one of the printed circuit boards 1 and 6 comprises two light emitting diode circuits 2 (top emitting). Owing to the fact that the flexible second printed circuit board 1 has been bended, ambient light in two directions can be produced, where the prior art printed circuit board 6 can only produce ambient light in one direction only (under the assumption that only one and the same kind of light emitting diode is used, for example only top-emitting diodes or for example only side emitting diodes).

In the FIGS. 13 and 14, the flexible printed circuit board 1 may be bended in a length direction and/or in a width direction. So, the flexible printed circuit board 1 may comprise one serial string of light emitting diode circuits 2 in a length direction and/or may comprise for example a first serial string in a length direction and a second serial string in a length direction, both serial strings being located next to each other (in parallel) in a width direction such that when being bended in the width direction, both strings will produce light in different directions.

Figure 15:
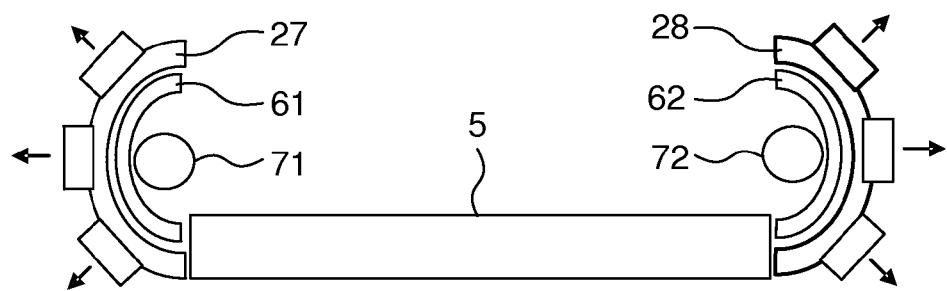
FIG. 15 shows a display with flexible printed circuit boards attached to moveable structures.

In the FIG. 15, a display 5 is shown with pieces 27 and 28 of the flexible printed circuit board attached to moveable structures 61 and 62. Other kinds of structures are not to be excluded, such as spiral springs etc. Motors 71 and 72 may operate the structures. Alternatively the structures may be operated by hand. The pieces 27 and 28 may be moved by shifting them partly or entirely and/or by rotating them partly or entirely and/or by changing their shape partly or entirely.

The flexible printed circuit board can be of a smaller size than the rigid printed circuit board (reduced width, reduced thickness) and allows reflectors and connectors to be avoided, which may further reduce a size of an ambient light system. The flexible printed circuit board does not need screws for attaching it. As a result, holes for screws in the printed circuit board are no longer necessary, which allows the light emitting diode pitch to be reduced, and holes for screws in a metal carrier or a heat sink are no longer necessary (better heat management). At a smaller pitch, ultra low power light emitting diodes can be used instead of high power light emitting diodes (better heat management), so side emitting light emitting diodes can be used too. At a standard 24 Volt supply voltage, six serially connected light emitting diodes can be used, without a DC/DC converter being required and without additional voltages needing to be generated, which reduces a number of interface lines. One driver having several outputs can drive several (groups of) light emitting diodes individually for a light output control and/or color control and/or intensity control per individual (group of) light emitting diode(s). A serial peripheral interface bus may for example be used to address different units. This way, "pixelated" ambient light has been created, whereby a light output and/or a color and/or an intensity can be controlled via the serial peripheral interface bus per pixel/layout cell of the ambient light.

According to a first option, a first roll comprises a first group of single electrical units, such as a first piece of flexible printed circuit board with a driver and light emitting diodes followed by a second, a third and a fourth piece with light emitting diodes only. According to a second option, a second roll comprises a second group of single electrical units, such as a first piece of flexible printed circuit board with a driver and light emitting diodes followed by a second piece without light emitting diodes such that it can be placed and bended in a corner, where in this case light emitting diodes are not required, followed by a third and a fourth piece with light emitting diodes only. According to a third option, a third roll comprises several third groups each one being identical to the first or the second group. According to a fourth option, a fourth roll comprises several fourth groups at least some of them different from the first, the second and the third group etc. So, one roll might be produced for one purpose or for different purposes.

Summarizing, an oblong sized printed circuit board 1 comprises light emitting diode circuitry 2, 3. Parts of the printed circuit board 1 are flexible in at least one direction, to improve a manufacturing efficiency. Preferably, the printed circuit board 1 can make curves in length and width directions and does not require holes for screws. The light emitting diode circuitry 2, 3 may comprise light emitting diode circuits 2 with light emitting diodes and other circuitry 3 such as a driver for driving light emitting diode circuits 2 individually for providing ambient light for a display 5. A device 100 comprising the printed circuit board 1 may further comprise the display 5. Such a device 100 is for example a television receiver/display device/screen device. The printed circuit board 1 may be attached to structures 61, 62 moveable by hand/machine for directing the ambient light. The device 100 may be a roll 101 for rolling up the printed circuit board 1.

While the invention has been illustrated and described in detail in the drawings and foregoing description, such illustration and description are to be considered illustrative or exemplary and not restrictive; the invention is not limited to the disclosed embodiments. For example, it is possible to operate the invention in an embodiment wherein different parts of the different disclosed embodiments are combined into a new embodiment.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A printed circuit board, having an oblong size and comprising:
   light emitting diode circuitry covering first areas of the printed circuit board;
   the light emitting diode circuitry comprising light emitting diode circuits and other circuitry, the other circuitry comprising a driver for driving the light emitting diode circuits individually for providing ambient light for a display; and
   second areas of the printed circuit board, wherein the second areas are more flexible than the first areas covered by the printed circuit board.

2. The printed circuit board as claimed in claim 1, the other circuitry further comprising a memory for storing color information for at least one of the light emitting diode circuits.

3. The printed circuit board as claimed in claim 1, each light emitting diode circuit comprising one or more light emitting diodes for providing the ambient light.

4. The printed circuit board as claimed in claim 1, including a first direction of the printed circuit board being a length direction such that the printed circuit board can make a curve in the length direction, and a second direction of the printed circuit board being a width direction such that the printed circuit board can make a curve in the width direction.

5. The printed circuit board as claimed in claim 4, the curve in the length direction allowing the printed circuit board to be rolled up or to be bended around an edge or a corner, and the curve in the width direction allowing the printed circuit board to be bended around a further edge or a further corner.

6. The printed circuit board as claimed in claim 1, the printed circuit board not comprising any holes for screws.

7. A device comprising:
   a display; and
   a printed circuit board coupled to the display, the printed circuit board having an oblong size and comprising:
      light emitting diode circuitry covering first areas of the printed circuit board, the light emitting diode circuitry comprising light emitting diode circuits and other circuitry, the other circuitry comprising a driver for driving the light emitting diode circuits individually for providing ambient light for a display, and
      second areas of the printed circuit board, wherein the second areas are more flexible than the first areas covered by the printed circuit board.

8. The device as claimed in claim 7, wherein each light emitting diode circuit includes one or more light emitting diodes for providing the ambient light.

9. The device as claimed in claim 7, wherein a first piece of the printed circuit board is attached to a first plane of a first device-part and a second piece of the printed circuit board is attached to a second plane of a second device-part, and the first and second pieces are separate pieces that are interconnected via an interconnection.

10. The device as claimed in claim 7, wherein a first piece of the printed circuit board is attached to a first plane of a first device-part and a second piece of the printed circuit board is attached to a second plane of a second device-part, the first and second planes being different planes, and a third piece of the printed circuit board is configured to make a curve to go from one of the first and second planes to the other one of the first and second planes, the third piece being an intermediate piece between the first and second pieces.

11. The device as claimed in claim 7, wherein a first piece of the printed circuit board is attached to a first side of a device-part and a second piece of the printed circuit board is attached to a second side of the device-part, the first and second sides being different sides, and a third piece of the printed circuit board is configured to make a curve to go around an edge or a corner of the device-part, the third piece being an intermediate piece between the first and second pieces.

12. The device as claimed in claim 7, wherein at least a part of the printed circuit board is attached to a moveable structure for directing the ambient light.

13. The device as claimed in claim 7, the device not comprising a reflector for reflecting the ambient light.

14. The device as claimed in claim 7, wherein the printed circuit board is configured to be rolled into a roll.

15. A method, comprising;
   providing a device with a printed circuit board having an oblong size and comprising light emitting diode circuitry covering first areas of the printed circuit board, the light emitting diode circuitry comprising light emitting diode circuits and other circuitry, the other circuitry comprising a driver for driving the light emitting diode circuits individually for providing ambient light for a display; and
   providing second areas of the printed circuit board, wherein the second areas are more flexible than the first areas covered by the printed circuit board.

\* \* \* \* \*